United States Patent
Liu et al.

(10) Patent No.: US 12,340,053 B2
(45) Date of Patent: Jun. 24, 2025

(54) TOUCH SENSING SYSTEM

(71) Applicant: Shanghai Hynitron Technology Co., Ltd., Shanghai (CN)

(72) Inventors: Hua Liu, Shanghai (CN); Dingfei Zhu, Shanghai (CN); Jianjun Wang, Shanghai (CN)

(73) Assignee: SHANGHAI HYNITRON TECHNOLOGY CO., LTD., Shanghai (CN)

( * ) Notice: Subject to any disclaimer, the term of this patent is extended or adjusted under 35 U.S.C. 154(b) by 0 days.

(21) Appl. No.: 18/696,930

(22) PCT Filed: Aug. 14, 2023

(86) PCT No.: PCT/CN2023/112835
§ 371 (c)(1),
(2) Date: Mar. 28, 2024

(87) PCT Pub. No.: WO2024/192958
PCT Pub. Date: Sep. 26, 2024

(65) Prior Publication Data
US 2025/0130672 A1   Apr. 24, 2025

(30) Foreign Application Priority Data
Mar. 20, 2023   (CN) .......................... 202310265136.4

(51) Int. Cl.
*G06F 3/044* (2006.01)
*G01D 5/24* (2006.01)
(Continued)

(52) U.S. Cl.
CPC .............. *G06F 3/044* (2013.01); *G01D 5/24* (2013.01); *G06F 3/0416* (2013.01); *H03K 17/962* (2013.01)

(58) Field of Classification Search
CPC ......... G01D 5/24; G06F 3/0416; G06F 3/044; H03K 17/962
See application file for complete search history.

(56) References Cited

U.S. PATENT DOCUMENTS

2016/0357284 A1* 12/2016 Wu ...................... G06F 3/04182
2019/0129533 A1*  5/2019 Liu ...................... G06F 3/04182
(Continued)

FOREIGN PATENT DOCUMENTS

CN      103134996 A      6/2013
CN      103149450 A      6/2013
(Continued)

OTHER PUBLICATIONS

International Search Report, issued in PCT/CN2023/112835, dated Nov. 16, 2023.
(Continued)

*Primary Examiner* — Amy He
(74) *Attorney, Agent, or Firm* — Daniel M. Cohn

(57) ABSTRACT

Disclosed is a touch sensing system, including a detected capacitor Cm. A transmitting electrode and a receiving electrode of a sensor are arranged at two ends of the detected capacitor Cm, and one end of the detected capacitor Cm corresponding to the receiving electrode is connected to a modulation module via a GM module. An excitation signal is input from the transmitting electrode. The GM module converts a charge transferred to the receiving electrode into a current and outputs same to the modulation module, and the modulation module performs integration and modulation according to the current to obtain an output parameter characterizing the detected capacitor Cm. Provided is a touch sensing system to reduce chip area and power consumption and improve the reliability of touch sensing.

11 Claims, 1 Drawing Sheet

(51) Int. Cl.
  G06F 3/041    (2006.01)
  H03K 17/96    (2006.01)

(56) References Cited

U.S. PATENT DOCUMENTS

| | | |
|---|---|---|
| 2021/0226626 A1 | 7/2021 | Ogirko |
| 2023/0100447 A1* | 3/2023 | Lanniel ................ H03K 17/975 |
| | | 324/686 |

FOREIGN PATENT DOCUMENTS

| | | |
|---|---|---|
| CN | 103308773 A | 9/2013 |
| CN | 103914189 A | 7/2014 |
| CN | 104679372 A | 6/2015 |
| CN | 105447434 A | 3/2016 |
| CN | 109375803 A | 2/2019 |
| CN | 111142705 A | 5/2020 |
| CN | 111181543 A | 5/2020 |
| CN | 111865313 A | 10/2020 |
| CN | 112865714 A | 5/2021 |
| CN | 113141184 A | 7/2021 |
| CN | 214473623 U | 10/2021 |
| CN | 115981507 A | 4/2023 |
| JP | 2020020769 A | 2/2020 |
| KR | 101569337 B1 | 11/2015 |

OTHER PUBLICATIONS

Written Opinion, issued in PCT/CN2023/112835, dated Nov. 16, 2023.
Examination Report, issued in CN202310265136.4 (priority application), by CNIPA, dated Apr. 23, 2023.

* cited by examiner

TOUCH SENSING SYSTEM

TECHNICAL FIELD

The present disclosure relates to the technical field of a sensor, and in particular to a touch sensing system.

BACKGROUND ART

A touch sensor is used as an important way of human-computer interaction because of its simple, direct and humanized design. Capacitive touch sensing has become the mainstream technology in mobile phone, tablet computer, wearable and other electronic products. Compared with resistive touch, infrared touch and ultrasonic touch, capacitive touch has obvious advantages in durability, multi-finger, portability and so on. There is capacitance between the receiving electrode of the sensor and the ground (self-capacitance) or the transmission electrode (mutual capacitance). When the human finger approaches the sensor, the capacitance value changes, the sensing chip detects the capacitance change, and transmits the detection signal to the host computer to determine the touch, gesture and other actions. Touch sensing analog front-end is very important for touch experience, which determines the sensitivity, accuracy and anti-interference performance of touch sensing.

At present, a common sensing scheme is to convert a capacitance change into a voltage change, integrate same through an integrator based on an operational amplifier, and obtain a capacitance change value via an analogue-to-digital converter. A larger integration capacitance limits the bandwidth of the integrator, a smaller integration capacitance tends to cause the integrator to saturate, and the use of a larger integration capacitance and obtaining a large bandwidth requires larger chip area and power consumption. Furthermore, using one ADC for each sensing channel increases the chip area and power consumption, multiplexing one ADC for multiple channels increases the complexity of control, and has higher requirements on the ADC conversion rate, so that the chip power consumption is greater or more advanced processes are required.

SUMMARY OF THE INVENTION

It is an object of the present disclosure to provide a touch sensing system to reduce chip area and power consumption and improve the reliability of touch sensing.

In order to achieve the above-mentioned object, the present disclosure provides a touch sensing system, including a detected capacitor Cm. A transmitting electrode and a receiving electrode of a sensor are arranged at two ends of the detected capacitor Cm, and one end of the detected capacitor Cm corresponding to the receiving electrode is connected to a modulation module via a GM module. An excitation signal is input from the transmitting electrode. The GM module converts a charge transferred to the receiving electrode into a current and outputs same to the modulation module, and the modulation module performs integration and modulation according to the current to obtain an output parameter characterizing the detected capacitor Cm.

Further, the modulation module includes: an integrating capacitor C1, a current source IMS_SNK, a current source IMS_SRC and a comparator CMP. The output of the GM module is connected to one end of the integrating capacitor C1, and the other end of the integrating capacitor C1 is grounded. The current source IMS_SNK is connected to one end of the integrating capacitor C1 through a switch SW1, and the current source IMS_SRC is connected to one end of the integrating capacitor C1 through a switch SW3; one end of the integrating capacitor C1 is also connected to a positive input terminal of the comparator CMP, a negative input terminal of the comparator CMP is connected to a reference voltage Vref, and an output signal of the comparator CMP is used for controlling the turning off or disconnecting of the switch SW1 and the switch SW3.

Further, a reset switch SW2 is connected between the positive input terminal and the negative input terminal of the comparator CMP.

Further, a NOT gate INV is connected between the output terminal of the comparator CMP and the switch SW3.

Further, the amplitude of the excitation signal of the transmitting electrode is VTX, and the charge of the receiving electrode is Qrx=VTX*Cm. The GM module converts the charge transferred to the receiving electrode into a current Iout and outputs same, and integrates and stores same on the integrating capacitor C1. The charge on the integrating capacitor C1 is Qc1=M*VTX*Cm, where M is an amplitude modulation coefficient of the GM module, and the voltage at the positive input terminal of the comparator CMP is Vcap. If Vcap is greater than Vref, the output of the comparator CMP is logic high, the switch SW1 is turned on, the switch SW3 is turned off, and the current source IMS_SNK releases the charge transferred to the integrating capacitor C1 until Vcap is less than Vref; when Vcap is less than Vref, the output of the comparator CMP is logic low, the switch SW1 is turned off, the switch SW3 is turned on, and the current source IMS_SRC charges the integrating capacitor C1. Further, the current value of the current source IMS_SNK is equal to that of the current source IMS_SRC, being equal to a current value IMS. When the current source IMS_SNK releases the charge transferred to the integrating capacitor C1, M*VTX*Cm=IMS*t1, where t1 is the time the quantized output of the comparator CMP is logic high—the time the quantized output is logic low during the measurement cycle time tm.

Further, the modulation module further includes: a current source ICOM connected to one end of the integrating capacitor C1 through a switch SW0. At the beginning of each cycle of the excitation signal of the transmitting electrode, the current source ICOM at t0 is turned on to compensate. When Vcap is greater than Vref by a threshold, the current source IMS_SNK releases the charge transferred to the integrating capacitor C1, so that M*VTX*Cm=ICOM*t0+IMS*t1.

Further, a digital processing module is also included for processing the output of the comparator CMP. The digital processing module includes a counting clock and a counter with a higher frequency. In each clock cycle, if the output of the comparator CMP is high, the counter increases by 1, and if the output of the comparator CMP is low, the counter decreases by 1, and finally a digital code corresponding to the size of the detected capacitor Cm is obtained, so as to achieve the detection of the detected capacitor Cm.

Further, each cycle of the excitation signal of the transmitting electrode includes a rising edge and a falling edge, and the GM module has a current output on both the rising edge and the falling edge.

Further, the current Iout is unidirectional after passing the GM module, i.e., when the excitation signal rises, the GM module outputs a current in a forward direction, and when the excitation signal falls, the GM module still outputs a current in a forward direction.

With the above-mentioned technical solution, the touch sensing system of the present disclosure includes a detected capacitor Cm. A transmitting electrode and a receiving electrode of a sensor are arranged at two ends of the detected capacitor Cm, and one end of the detected capacitor Cm corresponding to the receiving electrode is connected to a modulation module via a GM module. An excitation signal is input from the transmitting electrode. The GM module converts a charge transferred to the receiving electrode into a current and outputs same to the modulation module, and the modulation module performs integration and modulation according to the current to obtain an output parameter characterizing the detected capacitor Cm. Based on the structural design of GM-C SDM, the present disclosure can achieve high sensitivity, high accuracy and high noise immunity of touch sensing with a smaller chip area and power consumption.

The present disclosure can achieve capacitance-voltage-current conversion through the GM module, and has amplitude and phase modulation, so that the current Iout is unidirectional after the amplitude and phase modulation of the GM module, i.e., when the excitation signal rises, the GM module outputs a current in a forward direction, and when the excitation signal falls, the GM module still outputs a current in a forward direction, which simplifies the circuit design of the subsequent modulation module. In addition, the Gm module may amplify the signal to improve the signal-to-noise ratio or attenuate the signal to prevent the output saturation by modulating and converting the amplitude of the current Iout.

In addition, the charge on the integrating capacitor C1 is also modulated by the modulation module, and the output of the comparator CMP is processed to obtain a digital code corresponding to the size of the detected capacitor Cm, so as to achieve the detection of the detected capacitor Cm. Therefore the detection process is simple.

Moreover, the current source ICOM in the modulation module can achieve charge compensation, prevent the output saturation of the GM module, and further ensure the functional effect of the system.

DETAILED DESCRIPTION OF THE INVENTION

A touch sensing system of the present disclosure will now be described in more detail, with reference to the accompanying drawings, in which preferred embodiments of the present disclosure are shown. It should be understood that one skilled in the art can modify the present disclosure described herein while still achieving the advantageous effects of the present disclosure. Accordingly, the following description should be construed as broadly as known to those skilled in the art, and not as a limitation on the present disclosure.

The present disclosure is described in more detail in the following paragraphs by way of example with reference to the accompanying drawings. Advantages and features of the present disclosure will become apparent from the following description. It should be noted that the drawings are in very simplified form and use imprecise proportions merely to facilitate and clarify the description of the embodiments of the present disclosure.

Figure 1:
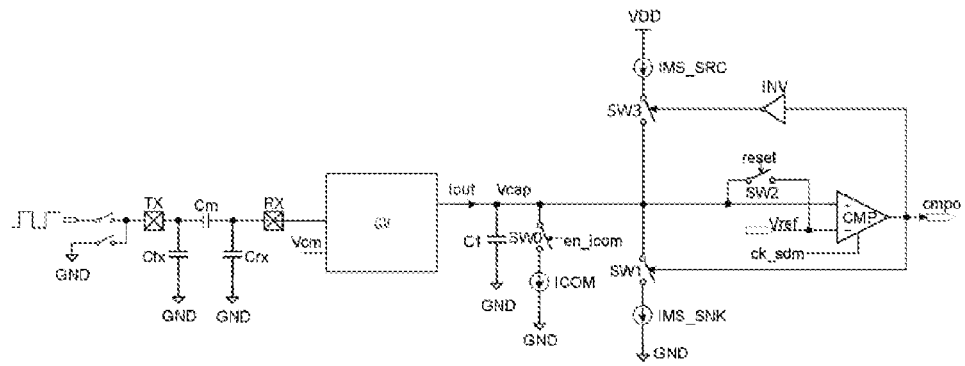
FIG. 1 is a schematic structural diagram of a touch sensing system in accordance with an embodiment of the present disclosure.

As shown in FIG. 1, the present embodiment provides a touch sensing system, including a detected capacitor Cm. A transmitting electrode and a receiving electrode of a sensor are arranged at two ends of the detected capacitor Cm, and one end of the detected capacitor Cm corresponding to the receiving electrode is connected to a modulation module via a GM module. An excitation signal is input from the transmitting electrode. The GM module converts a charge transferred to the receiving electrode into a current and outputs same to the modulation module, and the modulation module performs integration and modulation according to the current to obtain an output parameter characterizing the detected capacitor Cm.

When the voltage at two ends of the detected capacitor Cm needs to be converted into a current output, the transmitting electrode and the receiving electrode of the sensor may be arranged at the two ends of the detected capacitor Cm, and one end of the detected capacitor Cm corresponding to the receiving electrode may be connected to the modulation module ($\Delta\Sigma$ modulator) via the GM module, and the GM module can convert the change in voltage at two ends of the detected capacitor Cm into a change in current.

As shown in FIG. 1, Ctx and Crx respectively indicate the parasitic capacitance of the transmitting electrode TX and the receiving electrode RX to ground. The transmitting electrode may apply an excitation signal or ground to form mutual capacitance sensing and self-capacitance sensing respectively.

In addition, it is also possible to ground or switch in a pulsed signal VTX at the transmitting electrode through a switch.

Each cycle of the excitation signal of the transmitting electrode includes a rising edge and a falling edge, and the GM module has a current output on both the rising edge and the falling edge, i.e., two charge transfers may be performed in one cycle, increasing the measurement and obtaining a greater signal-to-noise ratio.

Wherein the modulation module includes: an integrating capacitor C1, a current source IMS_SNK, a current source IMS_SRC and a comparator CMP.

In order to achieve charge integration, in the present embodiment, in particular, the output of the GM module is connected to one end of the integrating capacitor C1, and the other end of the integrating capacitor C1 is grounded. And the current source IMS_SNK is connected to one end of the integrating capacitor C1 through a switch SW1; one end of the integrating capacitor C1 is also connected to a positive input terminal of the comparator CMP, a negative input terminal of the comparator CMP is connected to a reference voltage Vref, and an output signal of the comparator CMP is used for controlling the turning off or disconnecting of the switch SW1 and the switch SW3.

In addition, a reset switch SW2 is connected between the positive input terminal and the negative input terminal of the comparator CMP, so that the positive input terminal of the comparator CMP can be reset to the reference voltage Vref through the reset switch SW2 and the receiving electrode is reset to the common mode voltage Vom before the detection is started.

As a preferred embodiment, when an excitation signal is input from the transmitting electrode, the GM module converts a charge transferred to the receiving electrode into a current and outputs same to the modulation module, and the modulation module performs integration and modulation according to the current to obtain an output parameter characterizing the detected capacitor Cm.

Figure 2:
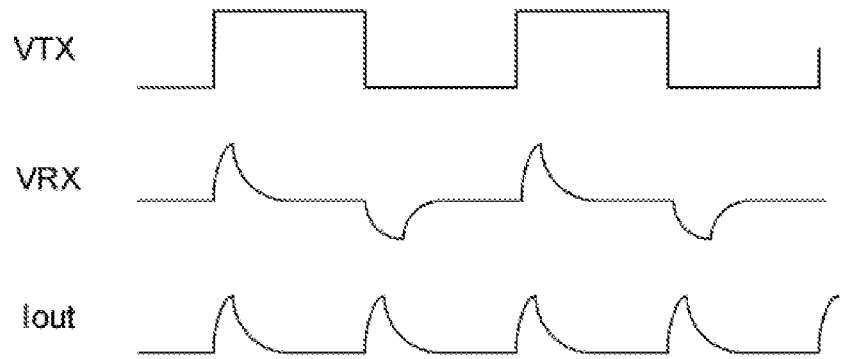
FIG. 2 is a current conversion diagram for a touch sensing system in accordance with an embodiment of the present disclosure.
Figure 3:
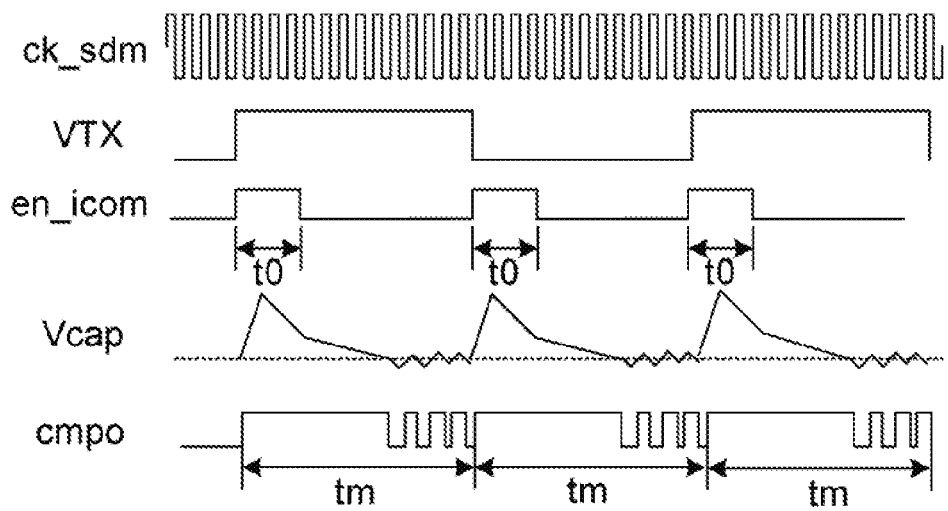
FIG. 3 is a timing diagram of a touch sensing system in accordance with an embodiment of the present disclosure.

More particularly, as shown in FIGS. 2-3, the GM module converts the charge transferred to the receiving electrode into a current Iout and outputs same, and integrates and stores same on the integrating capacitor C1. It should be noted that the current Iout is unidirectional after passing the GM module, i.e., when the excitation signal rises, the GM module outputs a current in a forward direction, and when the excitation signal falls, the GM module still outputs a current in a forward direction, which simplifies the design of the subsequent modulation module.

In addition, a NOT gate INV is connected between the output terminal of the comparator CMP and the switch SW3.

Since the amplitude of the excitation signal of the transmitting electrode is VTX, and the charge of the receiving electrode is Qrx=VTX*Cm, then the charge on the integrating capacitor C1 is Qc1=M*VTX*Cm, where M is an amplitude modulation coefficient of the GM module, and the voltage at the positive input terminal of the comparator CMP is Vcap. If Vcap is greater than Vref, the output of the comparator CMP is logic high, the switch SW1 is turned on, the switch SW3 is turned off, and the current source IMS_SNK releases the charge transferred to the integrating capacitor C1 until Vcap is less than Vref; when Vcap is less than Vref, the output of the comparator CMP is logic low, the switch SW1 is turned off, the switch SW3 is turned on, and the current source IMS_SRC charges the integrating capacitor C1. Continuous quantization of the residual charge on the Vcap is achieved by the process of the current source IMS_SNK releasing the charge transferred to the integrating capacitor C1 and the current source IMS_SRC charging the integrating capacitor C1, thereby improving the detection accuracy and the anti-interference.

In the present embodiment, the current value of the current source IMS_SNK is equal to that of the current source IMS_SRC, being equal to a current value IMS. When the current source IMS_SNK releases the charge transferred to the integrating capacitor C1, according to charge conservation, M*VTX*Cm=IMS*t1, where t1 is the time the quantized output of the comparator CMP is logic high—the time the quantized output is logic low during the measurement cycle time tm. Since M, VTX and Ims are preset in a touch sensing scenario, it can be seen from the above-mentioned formula that t1 is positively correlated with Cm. Further, in an embodiment of the present disclosure, the modulation module further includes: a current source ICOM connected to one end of the integrating capacitor C1 through a switch SW0. At the beginning of each cycle of the excitation signal of the transmitting electrode, the current source ICOM at t0 is turned on to compensate. When Vcap is greater than Vref by a threshold, the current source IMS_SNK releases the charge transferred to the integrating capacitor C1, wherein the control signal en_icom of the switch SW0 may be shown in FIG. 3. According to charge conservation, M*VTX*Cm=ICOM*t0+IMS*t1.

In another embodiment, a digital processing module is also included for processing the output of the comparator CMP. The digital processing module includes a counting clock and a counter with a higher frequency. In each clock cycle, if the output of the comparator CMP is high, the counter increases by 1, and if the output of the comparator CMP is low, the counter decreases by 1, and finally a digital code corresponding to the size of the detected capacitor Cm is obtained, so as to achieve the detection of the detected capacitor Cm.

In the present embodiment, the excitation signal is a square wave with amplitude of VTX. The positive input terminal of the comparator CMP can be reset to the reference voltage Vref through the reset switch SW2 and the receiving electrode is reset to the common mode voltage Vcm before the detection is started. At this time, the excitation signal of the transmitting electrode jumps from 0 to VTX. According to the principle of charge conservation, the charge transferred to the receiving electrode is Qrx=VTX*Cm. The GM module converts the charge transferred to the receiving electrode into a current Iout and outputs same, and integrates and stores same on the integrating capacitor C1, then Qc1=M*VTX*Cm. The current Iout is unidirectional after amplitude and phase modulation of the GM module, i.e., when the excitation signal rises, the GM module outputs a current in a forward direction, and when the excitation signal falls, the GM module still outputs a current in a forward direction, which simplifies the circuit design of the subsequent modulation module. In addition, the Gm module may amplify the signal to improve the signal-to-noise ratio or attenuate the signal to prevent the output saturation by modulating and converting the amplitude of the current Iout.

While the charge transferred to the integrating capacitor C1 will make Vcap greater than Vref, the output of the comparator CMP is logic high, the switch SW1 is turned on, the switch SW3 is turned off, and the charge transferred to the integrating capacitor C1 will be released. When Vcap is greater than Vref by a certain threshold, the current source ICOM at time to will be turned on to compensate, so as to reduce the modulation time of the current source IMS. According to charge conservation, M*VTX*Cm=ICOM*t0+IMS*t1, where t1 is the time the quantized output of the comparator CMP is logic high—the time the quantized output is logic low during the measurement cycle time tm; it can be seen that t1 is positively correlated with the detected capacitor Cm. A digital code corresponding to t1 may be obtained by performing digital processing on the output cmpo of the comparator CMP via a digital processing module, so as to achieve the detection of the detected capacitor Cm. When Vcap is less than Vref, the output of the comparator CMP is logic low, the switch SW1 is turned off, the switch SW3 is turned on, and the current source IMS_SRC charges the integrating capacitor C1.

Continuous quantization of the residual charge on the integrating capacitor C1 is performed before the next change edge of the transmitting electrode, thereby reducing the quantization error and improving the signal-to-noise ratio.

In summary, a touch sensing system according to the present disclosure has the following advantages:

The present disclosure can achieve high sensitivity, high accuracy and high noise immunity of touch sensing with smaller chip area and power consumption.

The present disclosure can achieve capacitance-voltage-current conversion through the detected capacitor Cm and the GM module, and has amplitude and phase modulation, so that the current Iout is unidirectional after the amplitude and phase modulation of the GM module, i.e., when the excitation signal rises, the GM module outputs a current in a forward direction, and when the excitation signal falls, the GM module still outputs a current in a forward direction, which simplifies the circuit design of the subsequent modulation module. In addition, the Gm module may amplify the signal to improve the signal-to-noise ratio or attenuate the signal to prevent the output saturation by modulating and converting the amplitude of the current Iout.

In addition, the charge on the integrating capacitor C1 is also modulated by the modulation module, and the output of the comparator CMP is processed to obtain a digital code corresponding to the size of the detected capacitor Cm, so as to achieve the detection of the detected capacitor Cm. Therefore the detection process is simple.

Moreover, the current source ICOM in the modulation module can achieve charge compensation, prevent the output saturation of the GM module, and further ensure the functional effect of the system.

It will be apparent to those skilled in the art that various modifications and variations may be made to the present disclosure without departing from the spirit or scope of the present disclosure. Thus, to the extent that these modifications and variations of the present disclosure are within the scope of the claims of the present disclosure and their equivalents, the present disclosure is also intended to include such modifications and variations.

The invention claimed is:

1. A touch sensing system, comprising a detected capacitor Cm, a transmitting electrode and a receiving electrode of a sensor being arranged at two ends of the detected capacitor Cm, one end of the detected capacitor Cm corresponding to the receiving electrode being connected to a modulation module via a GM module, an excitation signal being input from the transmitting electrode, the GM module converting a charge transferred to the receiving electrode into a current and outputting same to the modulation module, and the modulation module performing integration and modulation according to the current to obtain an output parameter characterizing the detected capacitor Cm;

the modulation module comprising: an integrating capacitor C1, a current source IMS_SNK, a current source IMS_SRC, a comparator CMP and a current source ICOM, the output of the GM module being connected to one end of the integrating capacitor C1, the other end of the integrating capacitor C1 being grounded, the current source IMS_SNK being connected to one end of the integrating capacitor C1 through a switch SW1, and the current source IMS_SRC being connected to one end of the integrating capacitor C1 through a switch SW3, one end of the integrating capacitor C1 being also connected to a positive input terminal of the comparator CMP, a negative input terminal of the comparator CMP being connected to a reference voltage Vref, and an output signal of the comparator CMP being used for controlling the turning off or disconnecting of the switch SW1 and the switch SW3;

a current value of the current source IMS_SNK being equal to that of the current source IMS_SRC, being equal to a current value IMS;

the current source ICOM being connected to one end of the integrating capacitor C1 through a switch SW0, at the beginning of each cycle of the excitation signal of the transmitting electrode, the current source ICOM at to being turned on to compensate; an amplitude of the excitation signal of the transmitting electrode being VTX, a voltage at the positive input terminal of the comparator CMP being Vcap; when Vcap is greater than Vref by a threshold, the current source IMS_SNK releasing the charge transferred to the integrating capacitor C1, so that M*VTX*Cm=ICOM*t0+IMS*t1, where t1 is the time the quantized output of the comparator CMP is logic high—the time the quantized output is logic low during the measurement cycle time tm, and M is an amplitude modulation coefficient of the GM module.

2. The touch sensing system according to claim 1, wherein a reset switch SW2 is connected between a positive input terminal and a negative input terminal of the comparator CMP.

3. The touch sensing system according to claim 1, wherein a NOT gate INV is connected between an output terminal of the comparator CMP and the switch SW3.

4. The touch sensing system according to claim 3, wherein a charge of the receiving electrode is Qrx=VTX*Cm; the GM module converts the charge transferred to the receiving electrode into a current Iout and outputs same, and integrates and stores same on the integrating capacitor C1; a charge on the integrating capacitor C1 is Qc1=M*VTX*Cm; if Vcap is greater than Vref, an output of the comparator CMP is logic high, the switch SW1 is turned on, the switch SW3 is turned off, and the current source IMS_SNK releases the charge transferred to the integrating capacitor C1 until Vcap is less than Vref; when Vcap is less than Vref, the output of the comparator CMP is logic low, the switch SW1 is turned off, the switch SW3 is turned on, and the current source IMS_SRC charges the integrating capacitor C1.

5. The touch sensing system according to claim 4, wherein when the current source IMS_SNK releases the charge transferred to the integrating capacitor C1, M*VTX*Cm=IMS*t1.

6. The touch sensing system according to claim 5, further comprising a digital processing module for processing the output of the comparator CMP, the digital processing module comprising a counting clock and a counter with a higher frequency; in each clock cycle, if the output of the comparator CMP is high, the counter increases by 1, and if the output of the comparator CMP is low, the counter decreases by 1, and finally a digital code corresponding to a size of the detected capacitor Cm is obtained, so as to achieve the detection of the detected capacitor Cm.

7. The touch sensing system according to claim 4, wherein each cycle of the excitation signal of the transmitting electrode comprises a rising edge and a falling edge, and the GM module has a current output on both the rising edge and the falling edge.

8. The touch sensing system according to claim 4, wherein the current Iout is unidirectional after passing the GM module, i.e., when the excitation signal rises, the GM module outputs a current in a forward direction, and when the excitation signal falls, the GM module still outputs a current in a forward direction.

9. The touch sensing system according to claim 1, further comprising a digital processing module for processing the output of the comparator CMP, the digital processing module comprising a counting clock and a counter with a higher frequency; in each clock cycle, if the output of the comparator CMP is high, the counter increases by 1, and if the output of the comparator CMP is low, the counter decreases by 1, and finally a digital code corresponding to a size of the detected capacitor Cm is obtained, so as to achieve the detection of the detected capacitor Cm.

10. The touch sensing system according to claim 9, wherein each cycle of the excitation signal of the transmitting electrode comprises a rising edge and a falling edge, and the GM module has a current output on both the rising edge and the falling edge.

11. The touch sensing system according to claim 9, wherein the current Iout is unidirectional after passing the GM module, i.e., when the excitation signal rises, the GM module outputs a current in a forward direction, and when the excitation signal falls, the GM module still outputs a current in a forward direction.

* * * * *